United States Patent
Chiou et al.

(10) Patent No.: US 7,208,065 B2
(45) Date of Patent: Apr. 24, 2007

(54) STRUCTURE FOR MEASURING THE ETCHING SPEED

(75) Inventors: Jing-Hung Chiou, Hsinchu (TW);
Kai-Hsiang Yen, Hsinchu (TW);
Chin-Horng Wang, Hsinchu (TW);
Chao-Chiun Liang, Taichung (TW);
Stella Y. H. Chen, Hsinchu (TW)

(73) Assignee: Industrial Technology Research Institute, Chu-Tung, Hsinchu (TW)

( * ) Notice: Subject to any disclaimer, the term of this patent is extended or adjusted under 35 U.S.C. 154(b) by 511 days.

(21) Appl. No.: 10/875,306

(22) Filed: Jun. 25, 2004

(65) Prior Publication Data

US 2004/0231796 A1 Nov. 25, 2004

Related U.S. Application Data

(62) Division of application No. 10/402,995, filed on Apr. 1, 2003, now Pat. No. 6,828,164.

(30) Foreign Application Priority Data

Dec. 17, 2002 (TW) .............................. 91136356 A

(51) Int. Cl.
*H01L 21/306* (2006.01)
(52) U.S. Cl. ................. 156/345.24; 118/715; 118/716; 118/717; 118/718; 118/728; 118/731; 118/732; 118/733
(58) Field of Classification Search ........... 156/345.24, 156/345.25, 345.26, 345.27, 345.28; 118/715, 118/733
See application file for complete search history.

(56) References Cited

U.S. PATENT DOCUMENTS 4,336,528 A * 6/1982 Kane .......................... 341/133
5,199,630 A * 4/1993 Felber et al. ................ 228/102
5,450,263 A * 9/1995 Desaigoudar et al. ....... 360/110
5,735,993 A * 4/1998 Yoshida .................. 156/345.27
6,642,877 B2* 11/2003 Leung ........................ 341/144
2003/0001594 A1* 1/2003 Hasbani ...................... 324/704
2004/0182513 A1* 9/2004 Barnes et al. .......... 156/345.24
2006/0006981 A1* 1/2006 Seo et al. .................... 338/320
2006/0194102 A1* 8/2006 Keshishian et al. ......... 429/160

FOREIGN PATENT DOCUMENTS

JP 04096346 A * 3/1992

OTHER PUBLICATIONS

In-Situ Etch Rate Sensor Arrays for Plasma Etch Processes, Mason Freed, Department of Mechanical Engineering, University of California, Berkeley, May 21, 1999.*

* cited by examiner

*Primary Examiner*—Ram N. Kackar
*Assistant Examiner*—Satish Chandra
(74) *Attorney, Agent, or Firm*—Birch, Stewart, Kolasch & Birch, LLP

(57) ABSTRACT

The specification discloses a structure and method for measuring the etching speed. A test layer is connected with several resistors. Etching the metal layer disconnects in order the resistors from the circuit. The equivalent resistance of the sensing resistor system is measured to obtain the etching speed. In consideration of the errors of the resistors, the invention also provides a structure that utilizes an IC layout technique to put an interdigitized dummy resistor beside the sensing resistors. By taking the ratio of the equivalent resistance of the sensing resistors and the dummy resistor, the invention can compute to obtain the etching speed.

6 Claims, 4 Drawing Sheets

STRUCTURE FOR MEASURING THE ETCHING SPEED

CROSS-REFERENCE TO RELATED APPLICATIONS

This application is a Divisional of application No. 10/402,995 (Now U.S. Pat. No. 6,828,164), filed on Apr. 1, 2003, and for which priority is claimed under 35 U.S.C. § 120; and this application claims priority of Application No. 91136356 filed in Taiwan on Dec. 17, 2002 under 35 U.S.C. § 119, the entire contents of all are hereby incorporated by reference.

BACKGROUND OF THE INVENTION

1. Field of Invention

The invention relates to a structure of measuring the etching speed and the associated method. In particular, the invention relates to a method of detecting the etching speed of a metal layer in a microelectromechanical system (MEMS) manufacturing process.

1. Related Art

In the manufacturing process of microelectromechanical system (MEMS) devices, some suspending structures (the infrared (IR) sensor, micro heater, gas sensor, and pressure sensor in sensors and the accelerator meter, micro motor, and gyroscope in actuators) are needed. The formation of such suspending structures is done by depositing a sacrifice layer, followed by stacking a structure layer, and finally etching the sacrifice layer to put the whole structure in a suspending state. Whether the suspending structure is perfect depends upon whether the etching is complete. The conventional judging method is to use a microscope or scanning electronic microscope (SEM) to view the etched part by naked eyes. However, the efficiency is not good so that such manufacturing process cannot satisfy the need for mass production. On the other hand, most structures that are checked using the microscope or SEM are limited to the cases where the structure layer stacked on the sacrifice layer is made of a transparent material. Thus, the conventional method does not apply to opaque materials. Moreover, in the MEMS manufacturing process, the etching speed control is also another important factor. The method of using the microscope or SEM has also a worse precision.

SUMMARY OF THE INVENTION

In view of the foregoing, the invention provides a structure and method for measuring the etching speed. An objective of the invention is to use the relation between the etching time and the equivalent resistance of sensing resistors in the structure to compute the etching speed.

To achieve the above objective, the disclosed structure includes a test layer and a plurality of sensing resistors. The sensing resistors are connected to the test layer and adjacent resistors. When measuring the etching speed, the sensing resistors form a circuit and one measures their equivalent resistance.

The disclosed method includes the following steps: providing a test layer and a plurality of sensing resistors connected to the test layer and adjacent sensing resistors, forming a circuit from the sensing resistors for measuring its equivalent resistance during etching, and measuring the equivalent resistance of the sensing resistor and obtaining the corresponding etching depth and time, thereby computing the etching speed.

In consideration of errors of resistors resulted from the manufacturing process, the invention also provides a structure for measuring the etching speed. The structure includes a test layer, several sensing resistors, and several dummy resistors. The sensing resistors are connected to the test layer and adjacent resistors. When measuring the etching speed, the sensing resistors form a circuit and one measures their equivalent resistance. Each of the dummy resistors is close to the corresponding sensing resistor. The two ends of each of the dummy resistors are connected to the two ends of its adjacent dummy resistors and form a parallel circuit. When measuring the etching speed of the test layer, the dummy resistors are combined with the sensing equivalent resistance to generate a reference value. This reference value is used to obtain the relation between the time and etching depth, thereby computing the etching speed.

Finally, the invention also provides a method for measuring the etching speed according to the previously introduced structure. The method includes the following steps. First, a test layer and several sensing resistors are provided. The test layer and the adjacent sensing resistors are connected to form a parallel circuit for providing a sensing equivalent resistance. Several dummy resistors are then provided; each dummy resistor is next to the corresponding sensing resistor. When measuring the etching speed on the test layer, a dummy equivalent resistance is produced to, along with the sensing equivalent resistance, generate a reference value. Finally, the reference value is used to compute the relation between the time and etching depth, thereby obtaining the etching speed.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
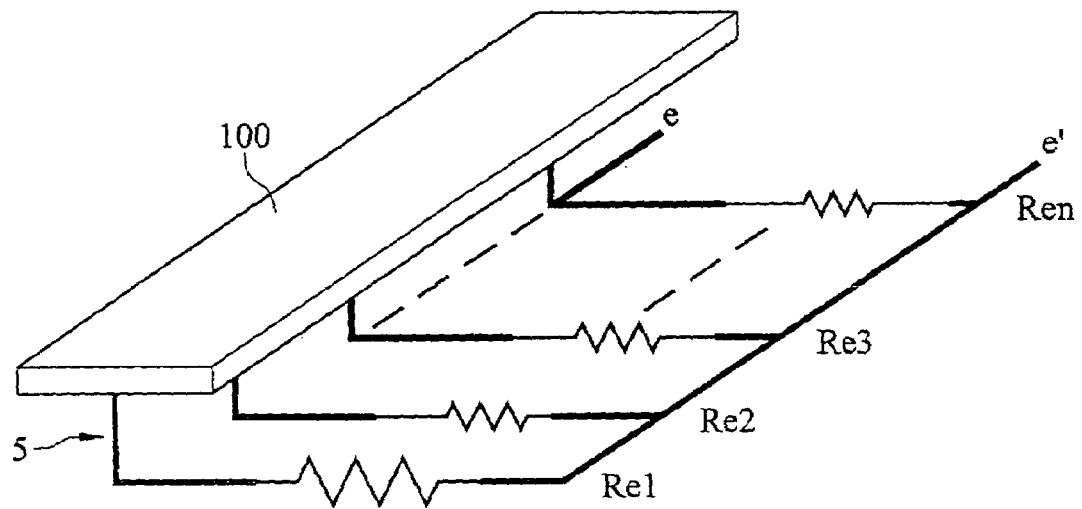
FIG. 1 is a schematic view of the structure that measures the etching speed according to the invention.
Figure 2:
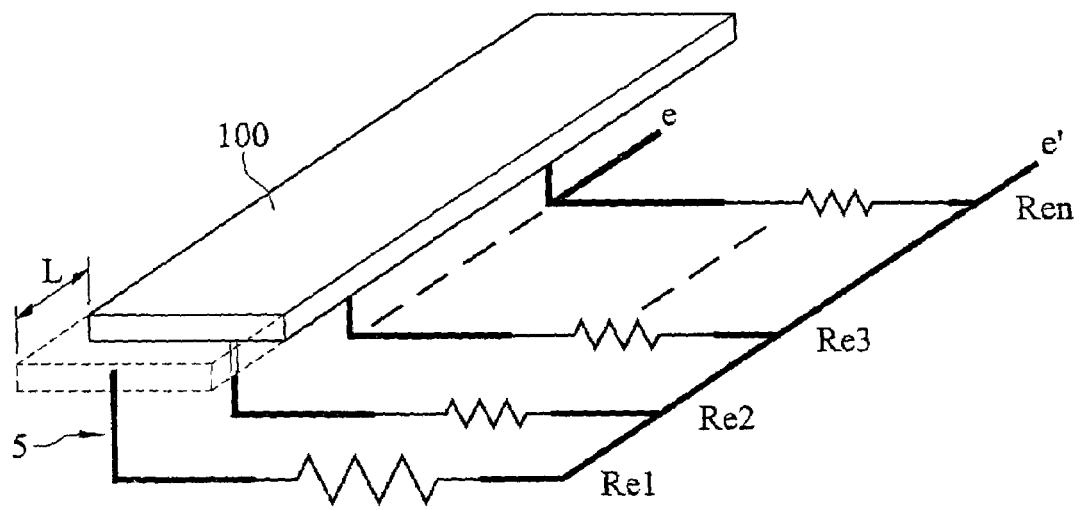
FIG. 2 is a schematic view of the disclosed structure during etching.

We use an embodiment to explain the feasibility of the invention with reference to FIGS. 1 and 2. A test layer 100 shown in FIG. 1 is a metal layer. It is connected to several sensing resistors Re1, Re2, . . . , and Ren using pins 5 and semiconductor connector technology. Each of the sensing resistors Re1, Re2, . . . , and Ren forms a circuit via the test layer 100 when measuring the etching speed. The sensing resistors Re1, Re2, . . . , and Ren also produce a sensing equivalent resistance Ree' by connecting to points e and e' in parallel. Therefore, $$Ree'=(Re1//Re2//Re3// \ldots //Ren).$$

With reference to FIG. 2, when etching starts the sensing resistors Re1, Re2, . . . , and Ren are disconnected from the circuit one by one. For example, the sensing equivalent resistance Ree' after the first resistor breaks is $$Ree'=(Re2//Re3// \ldots //Ren).$$

Figure 3:
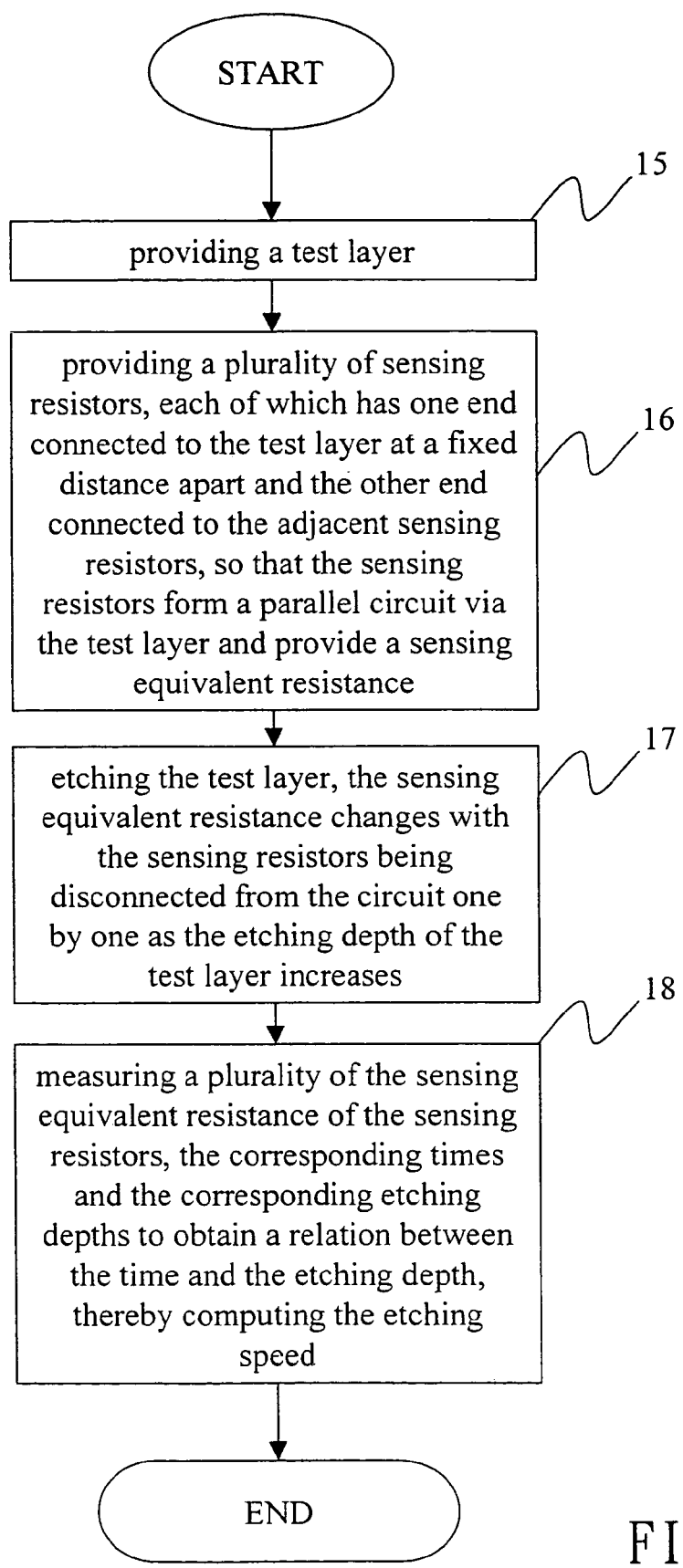
FIG. 3 is a flowchart of the disclosed method for measuring the etching speed.

Please refer to FIG. 3 for the explanation of the disclosed method for measuring the etching speed. First, a test layer is provided (step 15). The test layer is a metal layer. Several sensing resistors Re1, Re2, ..., and Ren are provided so as to provide a sensing equivalent resistance Ree' while measuring the etching speed (step 16). Since one end of each of the sensing resistors Re1, Re2, ..., and Ren is connected to the test layer 100 at a fixed distance apart and the other end to its adjacent sensing resistors Re1, Re2, ..., and Ren. Therefore, a parallel circuit is formed via the test layer 100 and provides a sensing equivalent resistance Ree'. One then starts to etch the test layer. As the etching depth L increases, the sensing resistors are disconnected from the circuit one by one, changing the sensing equivalent resistance Ree' (step 17). Finally, one measures the sensing equivalent resistance Ree', the corresponding time t, and the corresponding etching depth L. The relation between the time t and etching depth L is thus obtained to compute the etching speed (step 18). One makes an L-t plot from the measured data using Ree' as the intermediate variable. The slope of the curve in the plot is the etching speed. By measuring the tiny residual sensing equivalent resistance Ree', one can determine whether the metal layer is completely removed. If there is any metal left in the metal layer, a nonzero Ree' will be detected.

Considering errors in the resistors owing to the manufacturing process, the invention also provides a design to account for such effects. When making the above structure using IC layout technology, several dummy resistors Rd1, Rd2, Rd3, ..., and Rdn are interdigitized by the sensing resistors Re1, Re2, ..., and Ren at the same time. The dummy resistors Rd1, Rd2, Rd3, ..., and Rdn have fixed resistance. Therefore, the dummy equivalent resistance Rdd' is also fixed; namely, $$Rdd'=(Rd1//Rd2//Rd3// \ldots //Rdn).$$

Figure 4:
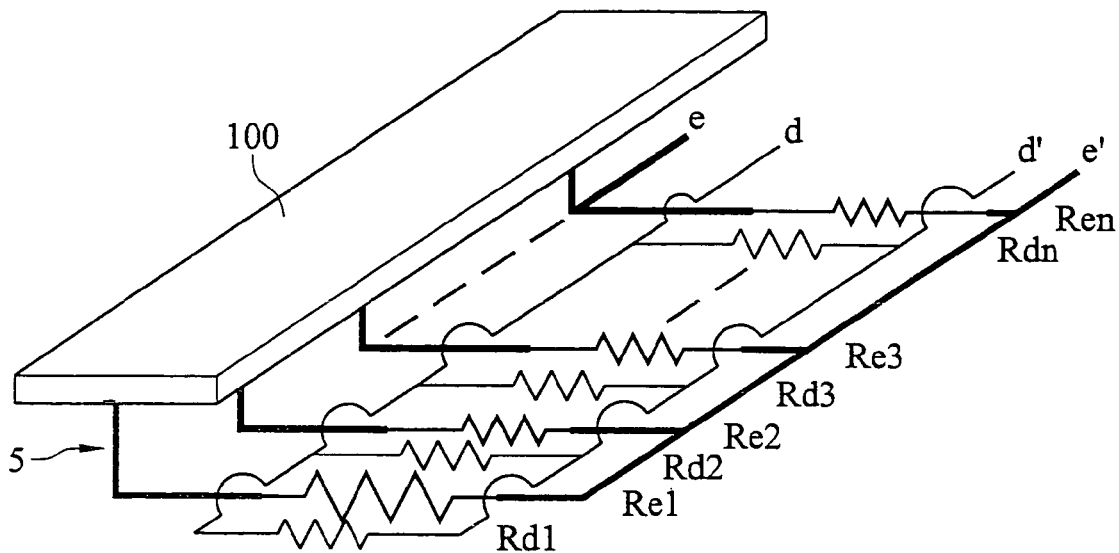
FIG. 4 is a schematic view of the disclosed structure with additional dummy resistors.
Figure 5:
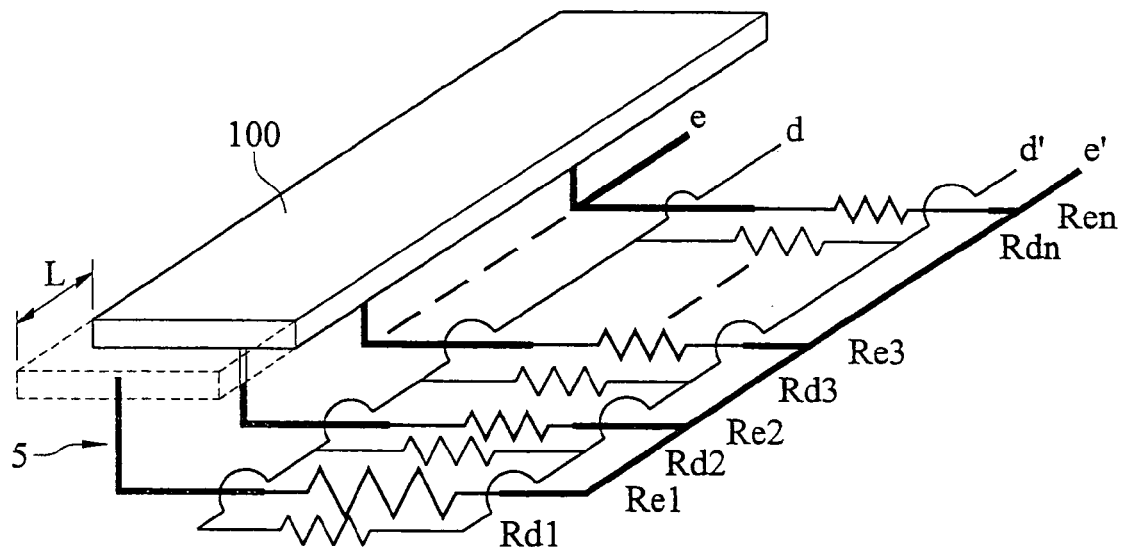
FIG. 5 is a schematic view of the disclosed structure with additional dummy resistors during etching.

When the etching process is going on, as shown in FIG. 4, the sensing resistors Re1, Re2, ..., and Ren are disconnected from the metal layer one by one while the dummy equivalent resistance Rdd' is unchanged. Therefore, after the first sensing resistor breaks from the circuit, one has $$Ree'=(Re2//Re3// \ldots //Ren),$$

$$Rdd'=(Rd1//Rd2//Rd3// \ldots //Rdn).$$

Figure 6:
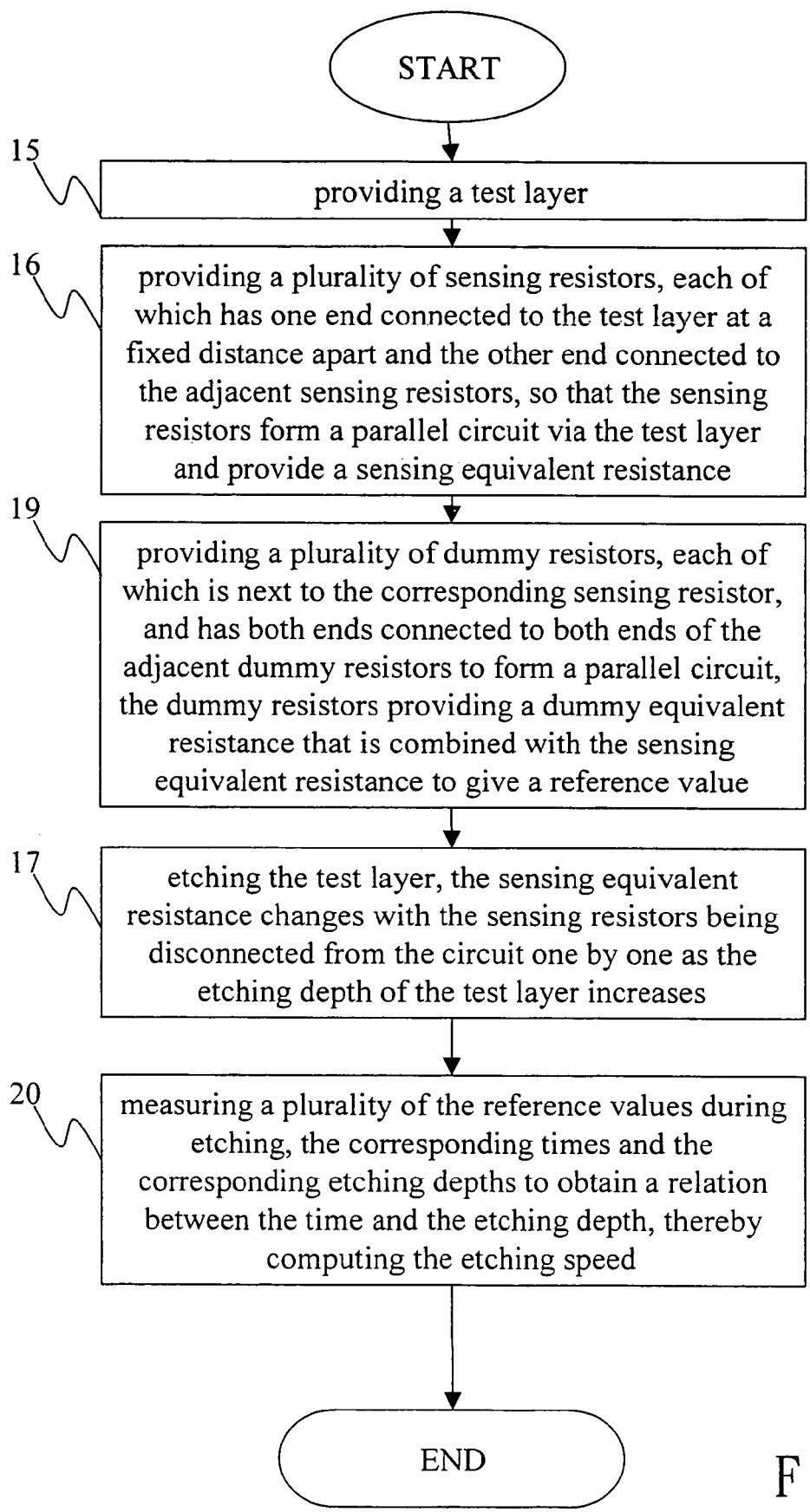
FIG. 6 is a flowchart of the disclosed method with additional dummy resistors for measuring the etching speed.

The method of measuring the etching speed with additional dummy resistors is shown in FIG. 6. First, a test layer 100 is provided (step 15). Several sensing resistors Re1, Re2, ..., and Ren are provided to provide a sending equivalent resistance Ree' (step 16). One end of each of the sensing resistors Re1, Re2, ..., and Ren is connected to the test layer 100 at a fixed distance apart while the other end to the adjacent sensing resistors Re1, Re2, ..., and Ren, so that they form a parallel circuit via the test layer 100 to provide a sensing equivalent resistance Ree'. Afterwards, several dummy resistors Rd1, Rd2, ..., and Rdn are provided to, along with the sensing equivalent resistance Ree', produce a reference value N (step 19). Since the dummy resistors Rd1, Rd2, ..., and Rdn are installed next to the sensing resistors Re1, Re2, ..., and Ren, respectively, a dummy equivalent resistance Rdd' is given to combine with the sensing equivalent resistance Ree' to generate a reference value N. Explicitly, $$Rdd'/Ree'=N.$$

When one etches the test layer, the etching depth increases gradually so that the sensing resistors are disconnected from the circuit one by one, thereby changing the sensing equivalent resistance (step 17). One also measures several reference values N and the corresponding time t and etching depth L, from which the etching speed is computed (step 20). The sensing equivalent resistance Ree' varies as the test layer 100 is etched; however, the dummy equivalent resistance Rdd' is equal to the initial value of the sensing equivalent resistance Ree' before etching. The purpose of the reference value N is to account for the errors on both the sensing resistors and the dummy resistors that are manufactured using the same process. By taking the ratio N, the errors on both types of resistors can be removed. Finally, one makes an L-t plot using N as the intermediate variable. The curve slope in the plot is the etching speed. By measuring the tiny residual reference N, one can determine whether the metal layer is completely removed. If there is any metal left in the metal layer, a nonzero N will be detected.

EFFECTS OF THE INVENTION

The invention measures the etching speed of a metal layer in an objective and accurate way for MEMS manufacturing processes. It can also be used to determine whether a sacrificial layer is completely removed in an etching process.

Certain variations would be apparent to those skilled in the art, which variations are considered within the spirit and scope of the claimed invention.

What is claimed is:

1. A structure for measuring the etching speed comprising:
   a test layer; and
   a plurality of sensing resistors, each of which has one end connected to the test layer at a fixed distance apart and the other end connected to the adjacent sensing resistors, so that the sensing resistors form a parallel circuit via the test layer and provide a sensing equivalent resistance;
   wherein the sensing resistors are disconnected from the circuit one by one as the test layer is etched, thereby changing the sensing equivalent resistance.

2. The structure of claim 1, wherein the sensing resistors are connected to the test layer using semiconductor connector technology.

3. The structure of claim 1, wherein each of the sensing resistors is connected to the test layer using a pin.

4. A structure for measuring the etching speed comprising:
   a test layer; and
   a plurality of sensing resistors, each of which has one end connected to the test layer at a fixed distance apart and the other end connected to the adjacent sensing resistors, so that the sensing resistors form a parallel circuit via the test layer and provide a sensing equivalent resistance, the sensing resistors being disconnected from the circuit one by one as the test layer is etched, thereby changing the sensing equivalent resistance; and
   a plurality of dummy resistors, each of which is next to the corresponding sensing resistor, and has both ends connected to both ends of the adjacent dummy resistors to form a parallel circuit, the dummy resistors providing a dummy equivalent resistance that is combined with the sensing equivalent resistance to give a reference value;

wherein the sensing equivalent resistance varies as the test layer is etched and the dummy equivalent resistance is equal to the initial value of the sensing equivalent resistance before etching, the reference value is obtained by taking the ratio between the sensing equivalent resistance and the dummy equivalent resistance when measuring the etching speed.

5. The structure of claim 4, wherein the sensing resistors are connected to the test layer using semiconductor connector technology.

6. The structure of claim 4, wherein each of the sensing resistors is connected to the test layer using a pin.

* * * * *